(12) United States Patent
Seok

(10) Patent No.: US 10,568,219 B2
(45) Date of Patent: Feb. 18, 2020

(54) ELECTRONIC CONTROL DEVICE

(71) Applicant: HYUNDAI AUTRON CO., LTD., Seoul (KR)

(72) Inventor: Man Ho Seok, Suwon-si (KR)

(73) Assignee: HYUNDAI AUTRON CO., LTD., Seoul (KR)

( * ) Notice: Subject to any disclaimer, the term of this patent is extended or adjusted under 35 U.S.C. 154(b) by 0 days.

(21) Appl. No.: 16/184,713

(22) Filed: Nov. 8, 2018

(65) Prior Publication Data
US 2019/0182971 A1    Jun. 13, 2019

(30) Foreign Application Priority Data
Dec. 13, 2017  (KR) ......................... 10-2017-0171014

(51) Int. Cl.
| | | |
|---|---|---|
| H05K 5/00 | (2006.01) | |
| H05K 1/14 | (2006.01) | |
| H05K 3/34 | (2006.01) | |
| H01R 12/72 | (2011.01) | |
| H05K 1/02 | (2006.01) | |
| H01R 12/77 | (2011.01) | |
| B60R 16/023 | (2006.01) | |

(52) U.S. Cl.
CPC ......... *H05K 5/0069* (2013.01); *H01R 12/727* (2013.01); *H05K 1/0278* (2013.01); *H05K 1/148* (2013.01); *H05K 3/3447* (2013.01); *H05K 5/0052* (2013.01); *B60R 16/023* (2013.01); *H01R 12/777* (2013.01); *H05K 2201/042* (2013.01); *H05K 2201/10189* (2013.01)

(58) Field of Classification Search
CPC .. H05K 5/0026; H05K 5/0069; H05K 5/0073; H05K 5/0078; H05K 5/0082
USPC ....................................................... 439/76.2
See application file for complete search history.

(56) References Cited

U.S. PATENT DOCUMENTS

| | | | |
|---|---|---|---|
| 4,811,165 A | | 3/1989 | Currier et al. |
| 5,103,375 A | * | 4/1992 | Cottingham ........... H05K 1/028 29/832 |
| 5,478,244 A | * | 12/1995 | Maue ................... B60R 16/0238 361/752 |

(Continued)

FOREIGN PATENT DOCUMENTS

| | | |
|---|---|---|
| JP | 2003-272754 A | 9/2003 |
| KR | 10-2017-0069621 A | 6/2017 |
| KR | 10-2017-0112324 A | 10/2017 |

*Primary Examiner* — Ross N Gushi
(74) *Attorney, Agent, or Firm* — Morgan, Lewis & Bockius LLP

(57) ABSTRACT

The present invention provides an electronic control device including: a housing which has an opening portion formed at one side thereof; printed circuit boards which are inserted into the housing; and a connector unit which includes connector pins coupled to the printed circuit boards and closes the opening portion of the housing, in which the printed circuit boards include a first printed circuit board, and a second printed circuit board which is connected to one side of the first printed circuit board through a substrate connecting portion and provided below the first printed circuit board, the connector unit includes a first connector pin connected to the first printed circuit board and a second connector pin connected to the second printed circuit board, and an outer connector cover of the connector unit is disposed to be directed upward.

11 Claims, 4 Drawing Sheets

(56) References Cited

U.S. PATENT DOCUMENTS

| | | | | |
|---|---|---|---|---|
| 5,657,203 | A * | 8/1997 | Hirao | H01L 21/4842 |
| | | | | 257/E23.066 |
| 5,998,738 | A * | 12/1999 | Li | H05K 1/028 |
| | | | | 174/250 |
| 6,655,017 | B1 * | 12/2003 | Formwalt, Jr. | H05K 5/0043 |
| | | | | 29/564.6 |
| 6,984,133 | B2 * | 1/2006 | Naitou | H05K 1/144 |
| | | | | 439/76.2 |
| 7,267,556 | B2 * | 9/2007 | Oka | H01R 9/2466 |
| | | | | 439/75 |
| 7,390,198 | B2 * | 6/2008 | Oka | H01R 9/2425 |
| | | | | 439/76.2 |
| 7,813,134 | B2 * | 10/2010 | Katsuro | H05K 7/20454 |
| | | | | 165/104.33 |
| 8,107,255 | B2 * | 1/2012 | Sakamoto | H05K 1/144 |
| | | | | 361/695 |
| 8,115,289 | B2 * | 2/2012 | Kishibata | H05K 1/148 |
| | | | | 257/415 |
| 9,185,822 | B2 * | 11/2015 | Shanbhogue | H05K 1/144 |
| 9,642,265 | B2 * | 5/2017 | Dresser | H01P 7/00 |
| 9,661,773 | B2 * | 5/2017 | Mijac | H05K 5/0056 |
| 2004/0257782 | A1 * | 12/2004 | Kerner | H05K 1/144 |
| | | | | 361/797 |
| 2006/0154499 | A1 * | 7/2006 | Naito | H05K 1/144 |
| | | | | 439/76.2 |
| 2008/0017174 | A1 * | 1/2008 | Kafer | B60T 8/3675 |
| | | | | 123/479 |
| 2014/0198470 | A1 * | 7/2014 | Shi | H05K 1/144 |
| | | | | 361/803 |
| 2015/0098198 | A1 | 4/2015 | Drew et al. | |
| 2017/0105290 | A1 * | 4/2017 | Kim | G11C 5/04 |

* cited by examiner

ELECTRONIC CONTROL DEVICE

CROSS-REFERENCE TO RELATED APPLICATION

The present application claims priority to Korean Patent Application No. 10-2017-0171014, filed on Dec. 13, 2017, the entire contents of which is incorporated herein for all purposes by this reference.

TECHNICAL FIELD

The present invention relates to an electronic control device. In more detail, the present invention relates to an electronic control device that may have a reduced size and allow multiple printed circuit boards to be efficiently coupled.

BACKGROUND ART

An electronic control device, which includes an electronic element for control and a printed circuit board on which the electronic element is mounted, is used in various fields.

An electronic control device such as an electronic control unit (ECU), which electronically controls various types of devices, is representatively mounted in a vehicle. The electronic control device serves to receive information from sensors, switches, or the like installed at various locations in the vehicle, process the received information, and perform various types of electronic control processes to improve ride quality and safety of the vehicle or provide a driver and an occupant with various types of conveniences.

Typically, the electronic control device is structured to include a housing, a printed circuit board (PCB) which is accommodated in the housing, and a connector which is coupled to one side of the circuit board so as to be connected to an external socket.

As an example, Korean Patent Application Laid-Open No. 10-2017-0112324 (published on Oct. 12, 2017) discloses an electronic control device for a vehicle, in which a printed circuit board, which has a connector coupled at one side thereof, is accommodated in a housing, and a coupling portion of the connector is formed to be connected to an external device in a direction opposite to a direction in which the printed circuit board is inserted.

However, the electronic control device in the related art has a problem in that it is difficult to reduce an overall length of the housing and an overall length of the connector.

Meanwhile, multiple electronic elements need to be mounted on the printed circuit board because the electronic control device includes various control functions, but the number of mountable electronic elements is restricted due to the size of the printed circuit board. There is a drawback in that an increase in number of electronic elements to be mounted on the printed circuit board inevitably causes an increase in overall size of the electronic control device.

SUMMARY OF THE INVENTION

The present invention has been made in an effort to provide an electronic control device that may have a reduced overall size and allow the number of mountable electronic elements to be increased.

An exemplary embodiment of the present invention provides an electronic control device including: a housing which has an opening portion formed at one side thereof; printed circuit boards which are inserted into the housing; and a connector unit which includes connector pins coupled to the printed circuit boards and closes the opening portion of the housing, in which the printed circuit boards include a first printed circuit board, and a second printed circuit board which is connected to one side of the first printed circuit board through a substrate connecting portion and provided below the first printed circuit board, the connector unit includes a first connector pin connected to the first printed circuit board and a second connector pin connected to the second printed circuit board, and an outer connector cover of the connector unit is disposed to be directed upward.

The first printed circuit board may be formed to be shorter than the second printed circuit board, and a length of a second connector inner pin of the second connector pin connected to the second printed circuit board may be longer than a length of a first connector inner pin of the first connector pin connected to the first printed circuit board.

The first connector inner pin and the second connector inner pin may be coupled to the first printed circuit board and the second printed circuit board, respectively, in a press-fit manner.

Both sides of the housing may include first guide portions which guide the insertion of the first printed circuit board, and second guide portions which guide the insertion of the second printed circuit board.

Each of the first and second guide portions may have stepped portions so that a width thereof is decreased from the opening portion.

A concave portion may be formed between the first guide portion and the second guide portion.

The first printed circuit board may have at least one escape hole penetratively formed vertically, and an electronic element mounted on the second printed circuit board may be exposed through the escape hole.

The housing may include a connector coupling portion configured by an outer rim of the opening portion, the connector unit may include a mounting cover which is coupled to surround the connector coupling portion, and a lateral surface of the connector coupling portion and a lateral surface of the mounting cover may be formed diagonally.

Another exemplary embodiment of the present invention provides an electronic control device including: a housing which has an opening portion formed at one side thereof; printed circuit boards which are inserted into the housing; and a connector unit which includes connector pins coupled to the printed circuit board and closes the opening portion of the housing, in which an outer connector cover of the connector unit, which is formed to protect a portion of the connector pin exposed to the outside, is disposed at an angle that is not horizontal to a direction in which the printed circuit board is inserted into the housing.

The printed circuit boards may include a first printed circuit board and a second printed circuit board which are connected through a substrate connecting portion at one side thereof, and lateral surfaces of the housing may include first guide portions which guide the first printed circuit board, and second guide portions which guide the second printed circuit board.

The connector unit may be coupled to the first printed circuit board and the second printed circuit board at a portion opposite to a portion where the substrate connecting portion is provided, and the connector unit may include a first connector pin coupled to the first printed circuit board, and a second connector pin coupled to the second printed circuit board.

The housing may include a connector coupling portion configured by an outer rim of the opening portion, the connector unit may include a mounting cover which is coupled to surround the connector coupling portion, and a lateral surface of the connector coupling portion and a lateral surface of the mounting cover may be formed diagonally.

According to the present invention, a direction of an outer connector cover of a connector connected to an external device is not parallel to a direction in which the printed circuit board accommodated in the housing is inserted, and as a result, it is possible to reduce an overall length of the electronic control device.

According to the present invention, multiple printed circuit boards may be provided to be disposed to define a stack in the housing, and as a result, it is possible to mount more electronic elements on the printed circuit board without increasing a size of the housing.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
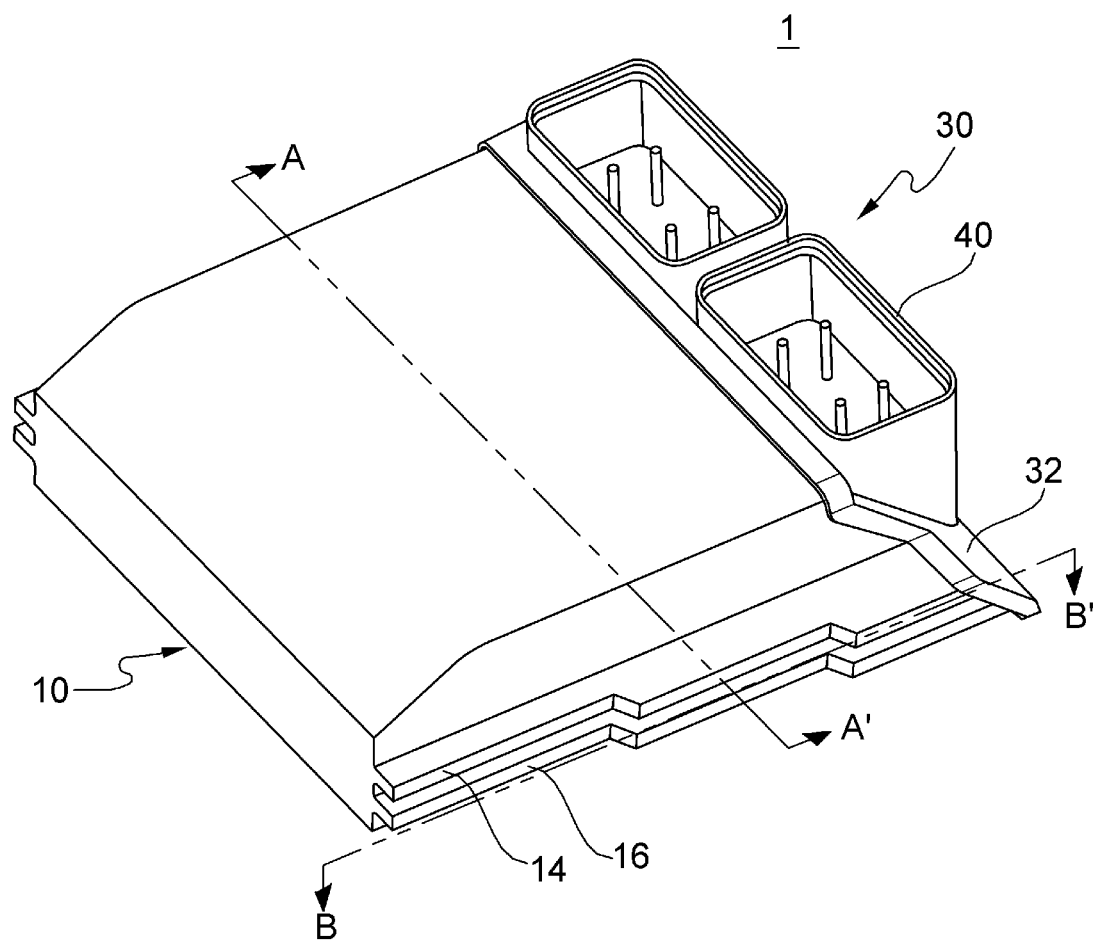
FIG. 1 is a perspective view of an electronic control device according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings. First, in assigning reference numerals to constituent elements of the respective drawings, it should be noted that the same constituent elements will be designated by the same reference numerals, if possible, even though the constituent elements are illustrated in different drawings. Further, in the following description of the present invention, a detailed description of publicly known configurations or functions incorporated herein will be omitted when it is determined that the detailed description may make the subject matter of the present invention unclear. Further, exemplary embodiments of the present invention will be described below, but the technical spirit of the present invention is not limited thereto and may of course be modified and variously carried out by those skilled in the art.

Figure 2:
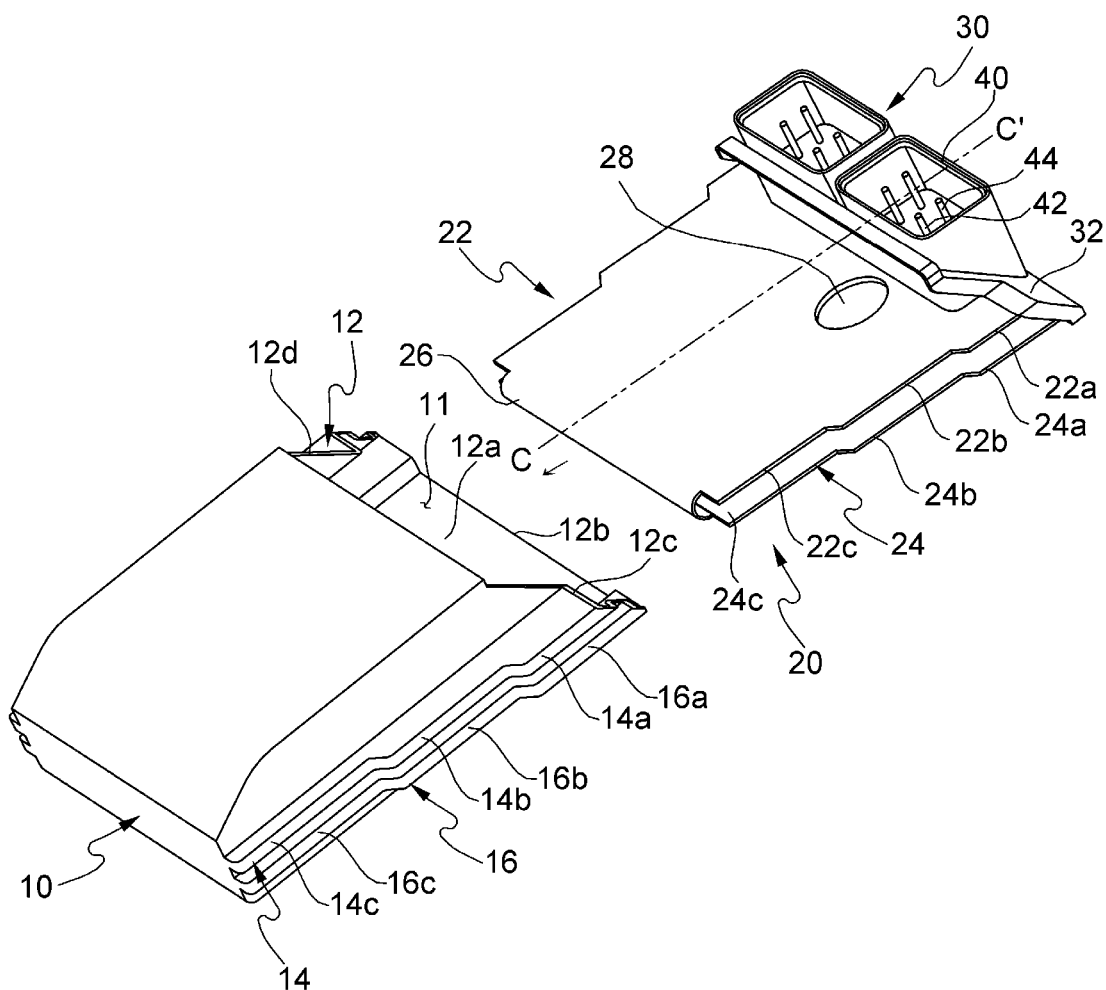
FIG. 2 is an exploded perspective view of the electronic control device according to the exemplary embodiment of the present invention.

FIG. 1 is a perspective view of an electronic control device according to an exemplary embodiment of the present invention, and FIG. 2 is an exploded perspective view of the electronic control device according to the exemplary embodiment of the present invention.

An electronic control device 1 according to the exemplary embodiment of the present invention includes a housing 10, a printed circuit board 20 which is inserted through an opening portion 11 of the housing 10, and a connector unit 30 which is coupled to one side of the printed circuit board 20 so as to close the opening portion of the housing 10.

The housing 10 may have a container shape that has the opening portion 11 formed at one side thereof. A rim of the opening portion 11 defines connector coupling portions 12. The connector coupling portions 12 may include first to fourth connector coupling portions 12a, 12b, 12c, and 12d. Specifically, the connector coupling portions 12 outside the opening portion 11 of the housing 10 may include the first connector coupling portion 12a which defines an upper rim, the second connector coupling portion 12b which defines a lower rim, and the third and fourth connector coupling portions 12c and 12d which define both rims.

One or more guide portions 14 and 16, which guide the printed circuit board 20 being inserted into the housing 10, are formed at both sides of the housing 10.

In the exemplary embodiment of the present invention, in a case in which the multiple printed circuit boards 20 are provided, the multiple guide portions 14 and 16 may be provided to correspond to the number of printed circuit boards 20. As described below, in a case in which the printed circuit boards 20 include a first printed circuit board 22 at an upper side and a second printed circuit board 24 at a lower side, a lateral surface of the housing 10 includes a first guide portion 14 at an upper side and a second guide portion 16 at a lower side.

In one exemplary embodiment, the printed circuit boards 20 include the first printed circuit board 22 at the upper side and the second printed circuit board 24 at the lower side, and a connector unit 30 is coupled to one side of each of the first printed circuit board 22 and the second printed circuit board 24. In addition, a substrate connecting portion 26, which connects the first printed circuit board 22 and the second printed circuit board 24, is provided at a portion opposite to the portion where the connector unit 30 is coupled. The substrate connecting portion 26 may be flexible or bendable.

The connector unit 30 includes a mounting cover 32 which is coupled to the connector coupling portion 12 while closing the opening portion 11 of the housing 10, and outer connector covers 40 which are coupled to the mounting cover 32 and have connector pins 42 and 44 therein. The two outer connector covers 40 are illustrated, but in the exemplary embodiment of the present invention, only a single outer connector cover 40 or three or more outer connector covers 40 may of course be provided.

In an electronic control device in the related art, a connector pin or an outer connector cover, which is exposed to the outside, is generally disposed in a direction opposite to a direction in which the printed circuit board is inserted into the housing. In contrast, the present invention is characterized in that the connector pins 42 and 44 and/or the outer connector covers 40 are disposed at an angle smaller than 180 degrees with respect to the direction in which the printed circuit board 20 is inserted into the housing 10. In one exemplary embodiment, the angle may be approximately 90 degrees.

Among the connector pins 42 and 44 provided in the connector unit 30, first connector pins 42 may be electrically and mechanically connected to the first printed circuit board 22, and second connector pins 44 may be electrically and mechanically connected to the second printed circuit board 24.

At least one escape hole 28 may be formed in the first printed circuit board 22. The escape hole 28 enables an electronic element, which has a height greater than a distance between the first printed circuit board 22 and the second printed circuit board 24, to be mounted on the second printed circuit board 24. In this case, the electronic element mounted on the second printed circuit board 24 may be exposed to an upper side through the escape hole 28.

Meanwhile, in the exemplary embodiment of the present invention, the guide portions 14 and 16, which are provided at both sides of the housing 10, may have stepped portions. In this case, widths of the guide portions 14 and 16 may be increased from a portion distant from the opening portion 11 of the housing 10 to a portion close to the opening portion 11 of the housing 10. That is, as illustrated in FIGS. 1 and 2, the guide portions 14 and 16 may include first guide steps 14a and 16a which have a largest width, second guide steps 14b and 16b which have a small width while having a stepped portion from the first guide steps 14a and 14b, and third guide steps 14c and 16c which have a smaller width while having a stepped portion from the second guide steps 14b and 16b.

Corresponding to the shapes of the guide portions 14 and 16, the first and second printed circuit boards 22 and 24 may have the stepped portions and include first portions 22a and 24a having a largest width, second portions 22b and 22c having a width smaller than the width of the first portions 22a and 24a, and third portions 22c and 24c having a width smaller than the width of the second portions 22b and 22c.

A state in which the printed circuit board 20 is inserted into and coupled to the housing 10 will be additionally described.

Figure 3:
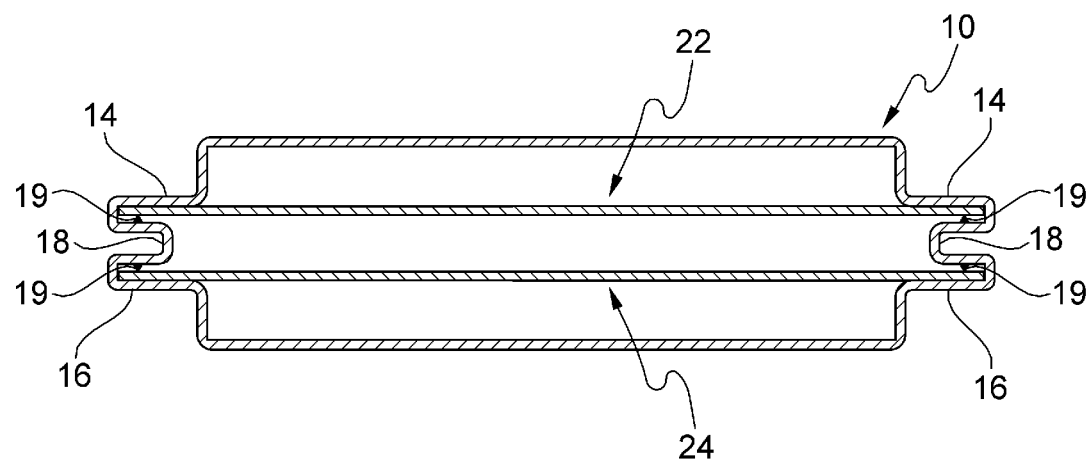
FIG. 3 is a cross-sectional view taken along line A-A' in FIG. 1.
Figure 4:
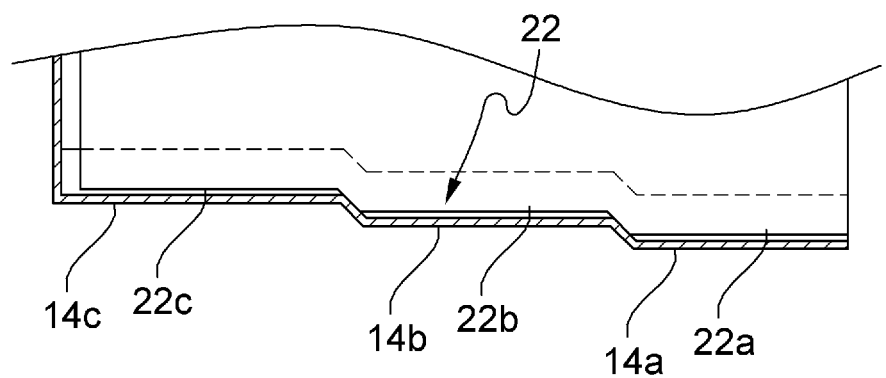
FIG. 4 is a cross-sectional view taken along line B-B' in FIG. 1.

FIG. 3 is a cross-sectional view taken along line A-A' in FIG. 1, and FIG. 4 is a cross-sectional view taken along line B-B' in FIG. 1.

Referring to FIG. 3, the first guide portions 14 and the second guide portions 16 are formed at both sides of the housing 10, and concave portions 18 are formed between the first guide portions 14 and the second guide portions 16. The first guide portion 14 and the second guide portion 16 are separated from each other vertically by the concave portion 18, the first printed circuit board 22 is inserted into the first guide portion 14, and the second printed circuit board 24 is inserted into the second guide portion 16.

Meanwhile, the first guide portion 14 and the second guide portion 16 may have pressing protrusions 19 for pressing the first printed circuit board 22 and the second printed circuit board 24. The pressing protrusions 19 press the first or second printed circuit board 22 or 24 so that the first or second printed circuit board 22 or 24 is fixed without swaying in the housing 10. The pressing protrusions 19 may be formed in various manners, that is, the pressing protrusions 19 may be formed by inserting a separate structure into the guide portions 14 and 16, deforming shapes of the guide portions 14 and 16, or being attached to the printed circuit boards 22 and 24.

FIG. 4 illustrates a state in which the guide portions 14 and 16 have the first guide steps 14a and 16a, the second guide steps 14b and 16b, and the third guide steps 14c and 16c, respectively, and the first and second printed circuit boards 22 and 24 have the first portions 22a and 24a, the second portions 22b and 22c, and the third portions 22c and 24c, respectively, such that the guide portions 14 and 16 are coupled corresponding to the stepped portions of the first and second printed circuit boards 22 and 24. With the stepped coupling configuration, the extent to which the printed circuit board 20 is inserted into the housing 10 may be restricted.

Figure 5:
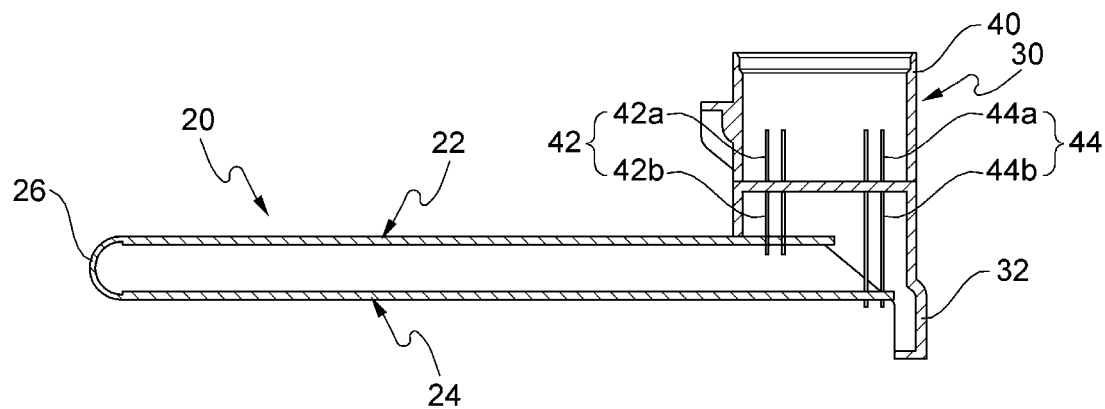
FIG. 5 is a cross-sectional view (cross-sectional view taken along line C-C' in FIG. 2) of an assembly made by coupling a connector unit and a printed circuit board in the electronic control device according to the exemplary embodiment of the present invention.

FIG. 5 is a cross-sectional view (cross-sectional view taken along line C-C' in FIG. 2) of an assembly made by coupling the connector unit and the printed circuit boards in the electronic control device according to the exemplary embodiment of the present invention.

As described above, the printed circuit boards 20 include the first printed circuit board 22 and the second printed circuit board 24, and the substrate connecting portion 26 that connects the first printed circuit board 22 and the second printed circuit board 24.

In one exemplary embodiment, the first printed circuit board 22 is shorter in length (length from the left side to the right side in FIG. 5) than the second printed circuit board 24.

Meanwhile, the connector unit 30 is coupled to the first printed circuit board 22 and the second printed circuit board 24 in a direction approximately perpendicular to the first printed circuit board 22 and the second printed circuit board 24. The outer connector cover 40 provided on the connector unit 30 is opened approximately upward. The first connector pins 42 provided in the outer connector cover 40 are connected to the first printed circuit board 22, and the second connector pins 44 are connected to the second printed circuit board 24.

In one exemplary embodiment, the first connector pins 42 include a first connector inner pin 42b which is connected to the first printed circuit board 22, and a first connector outer pin 42a which is exposed to the outside, and the second connector pins 44 include a second connector inner pin 44b which is connected to the second printed circuit board 24, and a second connector outer pin 44a which is exposed to the outside.

Because the first printed circuit board 22 is positioned above the second printed circuit board 24, a length of the first connector inner pin 42b is shorter than a length of the second connector inner pin 44b.

In one exemplary embodiment, the first connector inner pin 42b and the second connector inner pin 44b may be coupled to the first printed circuit board 22 and the second printed circuit board 24, respectively, in a press-fit manner.

Figure 6A:
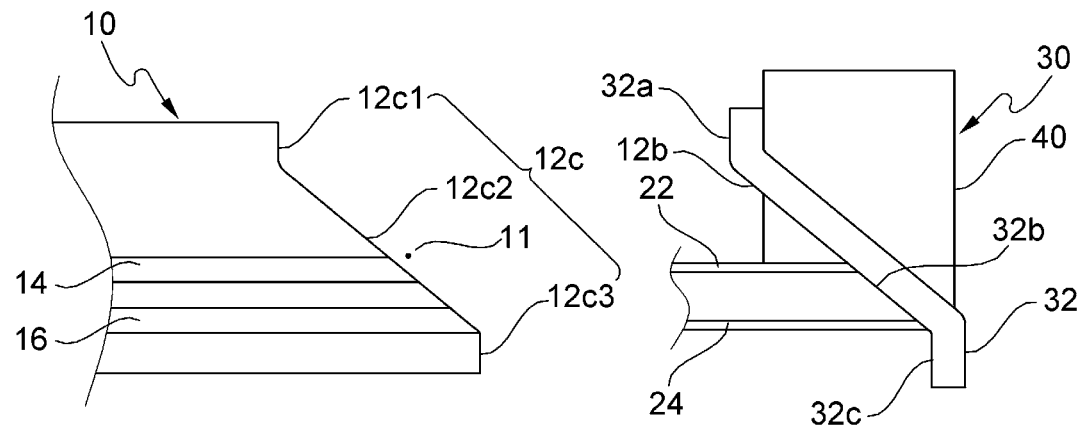
FIGS. 6A and 6B is a view illustrating a state in which the connector is coupled to an opening portion of a housing in the electronic control device according to the exemplary embodiment of the present invention.
Figure 6B:
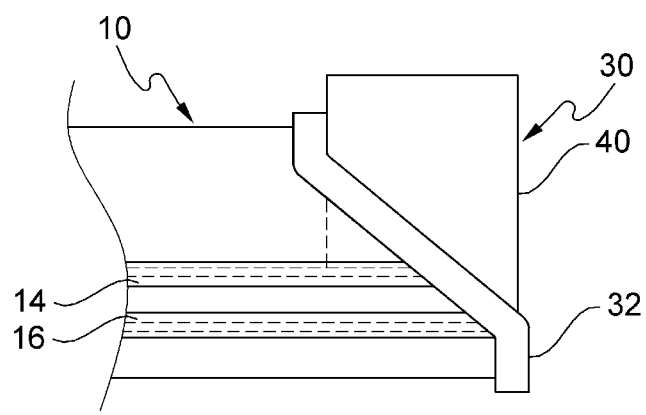

FIG. 6 is a view illustrating a state in which the connector is coupled to the opening portion of the housing in the electronic control device according to the exemplary embodiment of the present invention.

A configuration in which the connector unit 30 is coupled to the housing 10 will be described with reference to FIG. 6.

The third and fourth connector coupling portions 12c and 12d, which are formed at both sides among the connector coupling portions 12 outside the opening portion 11 of the housing 10, are formed approximately diagonally. Likewise, both sides of the mounting cover 32 of the connector unit 30 are also formed diagonally to correspond to the shapes of the third and fourth connector coupling portions 12c and 12d. Unlike the related art, since the outer connector cover 40 of the connector unit 30 is formed at an angle smaller than 180 degrees (in one exemplary embodiment, 90 degrees) with respect to the direction in which the printed circuit board is inserted, the aforementioned configuration is provided to more easily couple the connector unit 30 and the housing 10.

For example, the third connector coupling portion 12c (the fourth connector coupling portion 12d may be configured similar to the third connector coupling portion 12c) may have a first coupling portion 12c1 which extends downward approximately vertically, a second coupling portion 12c2 which extends diagonally from the first coupling portion 12c1, and a third coupling portion 12c3 which extends downward approximately vertically from the second coupling portion 12c2. A lateral portion of the mounting cover 32 may have a first vertical portion 32a, a diagonal portion 32b, and a second vertical portion 32c so as to correspond to the third connector coupling portion 12c.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control device comprising:
   a housing which has an opening portion formed at one side thereof;
   printed circuit boards which are inserted into the housing; and
   a connector unit which includes connector pins coupled to the printed circuit boards and closes the opening portion of the housing,
   wherein the printed circuit boards include a first printed circuit board, and a second printed circuit board which is connected to one side of the first printed circuit board through a substrate connecting portion and provided below the first printed circuit board, the connector unit includes a first connector pin connected to the first printed circuit board and a second connector pin connected to the second printed circuit board, and an outer connector cover of the connector unit is disposed to be directed upward.

2. The electronic control device of claim 1, wherein the first printed circuit board is formed to be shorter than the second printed circuit board, and a length of a second connector inner pin of the second connector pin connected to the second printed circuit board is longer than a length of a first connector inner pin of the first connector pin connected to the first printed circuit board.

3. The electronic control device of claim 2, wherein the first connector inner pin and the second connector inner pin are coupled to the first printed circuit board and the second printed circuit board, respectively, in a press-fit manner.

4. The electronic control device of claim 1, wherein both sides of the housing include first guide portions which guide the insertion of the first printed circuit board, and second guide portions which guide the insertion of the second printed circuit board.

5. The electronic control device of claim 4, wherein each of the first and second guide portions has stepped portions so that a width thereof is decreased from the opening portion.

6. The electronic control device of claim 4, wherein a concave portion is formed between the first guide portion and the second guide portion.

7. The electronic control device of claim 1, wherein the first printed circuit board has at least one escape hole penetratively formed vertically, and an electronic element mounted on the second printed circuit board is exposed through the escape hole.

8. The electronic control device of claim 1, wherein the housing includes a connector coupling portion configured by an outer rim of the opening portion, the connector unit includes a mounting cover which is coupled to surround the connector coupling portion, and a lateral surface of the connector coupling portion and a lateral surface of the mounting cover are formed diagonally.

9. An electronic control device comprising:
   a housing which has an opening portion formed at one side thereof;
   printed circuit boards which are inserted into the housing; and
   a connector unit which includes connector pins coupled to the printed circuit boards and closes the opening portion of the housing,
   wherein the printed circuit boards include a first printed circuit board, and a second printed circuit board connected to a side of the first printed circuit board through a substrate connecting portion and provided below the first printed circuit board,
   wherein the connector unit includes an outer connector cover formed to protect a portion of the connector pins,
   wherein the connector pins are connected to the first printed circuit board or the second printed circuit board so that longitudinal axes of the connector pins are aligned in a direction perpendicular to the first printed circuit board or the second printed circuit board, and
   wherein lateral surfaces of the housing include first guide portions which guide the first printed circuit board, and second guide portions which the second printed circuit board.

10. The electronic control device of claim 9,
    wherein the connector pins include a first connector pin and a second connector pin, and
    wherein the connector unit is coupled to the first printed circuit board and the second printed circuit board at a portion opposite to a portion where the substrate connecting portion is provided, and the connector unit includes the first connector pin coupled to the first printed circuit board, and the second connector pin coupled to the second printed circuit board.

11. The electronic control device of claim 9, wherein the housing includes a connector coupling portion configured by an outer rim of the opening portion, the connector unit includes a mounting cover which is coupled to surround the connector coupling portion, and a lateral surface of the connector coupling portion and a lateral surface of the mounting cover are formed diagonally.

* * * * *